US010854447B2

(12) United States Patent
Nagaoka (10) Patent No.: US 10,854,447 B2
(45) Date of Patent: Dec. 1, 2020

(54) FILM FORMING METHOD, METHOD OF MANUFACTURING SEMICONDUCTOR DEVICE, AND FILM FORMING DEVICE

(71) Applicant: Denso Corporation, Kariya (JP)

(72) Inventor: Tatsuji Nagaoka, Nagakute (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 16/238,663

(22) Filed: Jan. 3, 2019

(65) Prior Publication Data

US 2019/0214248 A1 Jul. 11, 2019

(30) Foreign Application Priority Data

Jan. 11, 2018 (JP) .................... 2018-002839

(51) Int. Cl.
*C23C 16/448* (2006.01)
*H01L 21/02* (2006.01)
*H01L 21/67* (2006.01)
*C23C 16/02* (2006.01)
*C23C 16/40* (2006.01)
*C23C 16/46* (2006.01)

(52) U.S. Cl.
CPC ...... *H01L 21/0262* (2013.01); *C23C 16/0209* (2013.01); *C23C 16/401* (2013.01); *C23C 16/403* (2013.01); *C23C 16/4486* (2013.01); *C23C 16/46* (2013.01); *H01L 21/0242* (2013.01); *H01L 21/02422* (2013.01); *H01L 21/02565* (2013.01); *H01L 21/02658* (2013.01); *H01L 21/67109* (2013.01); *H01L 21/02414* (2013.01); *H01L 21/02661* (2013.01)

(58) Field of Classification Search
CPC .................................................. C23C 16/4486
See application file for complete search history.

(56) References Cited

U.S. PATENT DOCUMENTS

2013/0119376 A1* 5/2013 Sasagawa ......... H01L 29/66742
257/43

FOREIGN PATENT DOCUMENTS

| CN | 1263569 A | 8/2000 |
|----|-----------|--------|
| JP | 2017-133077 A | 8/2017 |
| WO | 9902756 A1 | 1/1999 |

OTHER PUBLICATIONS

Machine translation of Katori, JP-2017-133077 (Year: 2017).*

* cited by examiner

*Primary Examiner* — Peniel M Gumedzoe
*Assistant Examiner* — Christopher A Johnson
(74) *Attorney, Agent, or Firm* — Dinsmore & Shohl LLP (57) ABSTRACT

A film forming method of forming a film on a substrate includes: annealing the substrate; and supplying mist of a raw material solution of the film to a surface of the substrate after the annealing while heating the substrate at a temperature lower than a temperature of the substrate during the annealing.

1 Claim, 4 Drawing Sheets

FILM FORMING METHOD, METHOD OF MANUFACTURING SEMICONDUCTOR DEVICE, AND FILM FORMING DEVICE

CROSS-REFERENCE TO RELATED APPLICATION

The present application claims priority to Japanese Patent Application No. 2018-002839 filed on Jan. 11, 2018, incorporated herein by reference in its entirety.

BACKGROUND

1. Technical Field

A technique disclosed in this specification relates to a film forming method, method of manufacturing semiconductor device and a film forming device.

2. Description of Related Art

Japanese Unexamined Patent Application Publication No. 2017-133077 (JP 2017-133077 A) discloses a technique of forming a film on a substrate. In the technique, mist of a raw material solution of a film is supplied to a surface of a substrate while heating the substrate. The mist attached to the surface of the substrate causes a chemical reaction to occur on the substrate. As a result, a film is formed on the substrate. Hereinafter, this film forming technique will be called mist chemical vapor deposition (CVD).

SUMMARY

General CVD (CVD other than the mist CVD) is performed in a reduced-pressure atmosphere (for example, vacuum). Therefore, even in a case where impurities are attached to a surface of a substrate before performing CVD, the impurities are vaporized in a reduced-pressure atmosphere such that the surface of the substrate is cleaned. On the other hand, in the mist CVD, it is necessary to supply mist (that is, liquid droplets) of a raw material solution to a surface of a substrate. Therefore, the mist CVD is performed under a relatively high pressure (for example, the atmospheric pressure). Accordingly, in the mist CVD, even in a case where impurities are attached to a surface of a substrate, the impurities are not vaporized. In a case where a film is formed on the substrate to which the impurities are attached, the impurities are incorporated into the film. As a result, the quality of the film deteriorates. Accordingly, this specification provides a technique of suppressing incorporation of impurities attached to a surface of a substrate into a film in the mist CVD.

A first aspect of the disclosure relates to a film forming method of forming a film on a substrate, the film forming method including: annealing the substrate; and supplying mist of a raw material solution of the film to a surface of the substrate after the annealing while heating the substrate at a temperature lower than a temperature of the substrate during the annealing.

In the film forming method according to the first aspect, the substrate may be formed of an oxide material, and the annealing may be performed in a state where the substrate is disposed in gas including oxygen.

In the film forming method according to the first aspect, the gas may have a higher oxygen partial pressure than the atmosphere.

In the film forming method according to the first aspect, the substrate may be formed of an oxide material, and the annealing may be performed in a state where the substrate is disposed in gas including at least one of water mist and water vapor.

In the film forming method according to the first aspect, the annealing may be performed in a state where the substrate is disposed in flowing gas.

In the film forming method according to the first aspect, the annealing and the supply of the mist of the raw material solution to the surface of the substrate may be performed in a common furnace.

In the film forming method according to the first aspect, during the annealing, the substrate may be heated to a temperature of 500° C. or higher.

In the film forming method according to the first aspect, the film may be a crystalline film of a semiconductor.

A second aspect of the disclosure relates to a method of manufacturing a semiconductor device, the method including forming the film using the film forming method according to the first aspect.

A third aspect of the disclosure relates to a film forming device that forms a film on a substrate, the film forming device including a furnace, a heater, a mist supply device, and a control device. In the furnace, the substrate is disposed. The heater is configured to heat the substrate in the furnace. The mist supply device is configured to supply mist of a raw material solution of the film into the furnace. The control device is configured to control the heater and the mist supply device. The control device is configured to cause the heater to anneal the substrate and to cause the mist supply device to supply the mist to a surface of the substrate after the annealing while causing the heater to heat the substrate at a temperature lower than a temperature of the substrate during the annealing.

In the film forming method, the annealing step is performed before the film forming step. By annealing the substrate, impurities attached to the surface of the substrate are vaporized such that the impurities are removed from the surface of the substrate. As a result, the surface of the substrate is cleaned. By supplying the mist of the raw material solution to the surface of the substrate after the annealing, a film is formed on the substrate. In this step, the temperature of the substrate is controlled to be lower than the temperature of the substrate during the annealing. That is, the raw material solution can be supplied to the surface of the substrate in the form of mist (that is, liquid droplets). Since the surface of the substrate is cleaned, incorporation of impurities into the film formed on the substrate is suppressed. Therefore, a high-quality film can be formed.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION

Embodiments of a film forming device and a film forming method for forming a film on a substrate will be described below. The film that is formed on the substrate may be an oxide film such as silicon oxide ($SiO_2$), aluminum oxide ($Al_2O_3$), or gallium oxide ($Ga_2O_3$) or may be another film. The film may be a semiconductor film or an insulating film. As described above, the film formed on the substrate is not particularly limited. The substrate may be an insulating substrate such as sapphire, or may be a semiconductor substrate such as a gallium oxide substrate. A material of the substrate is not particularly limited.

Figure 1:
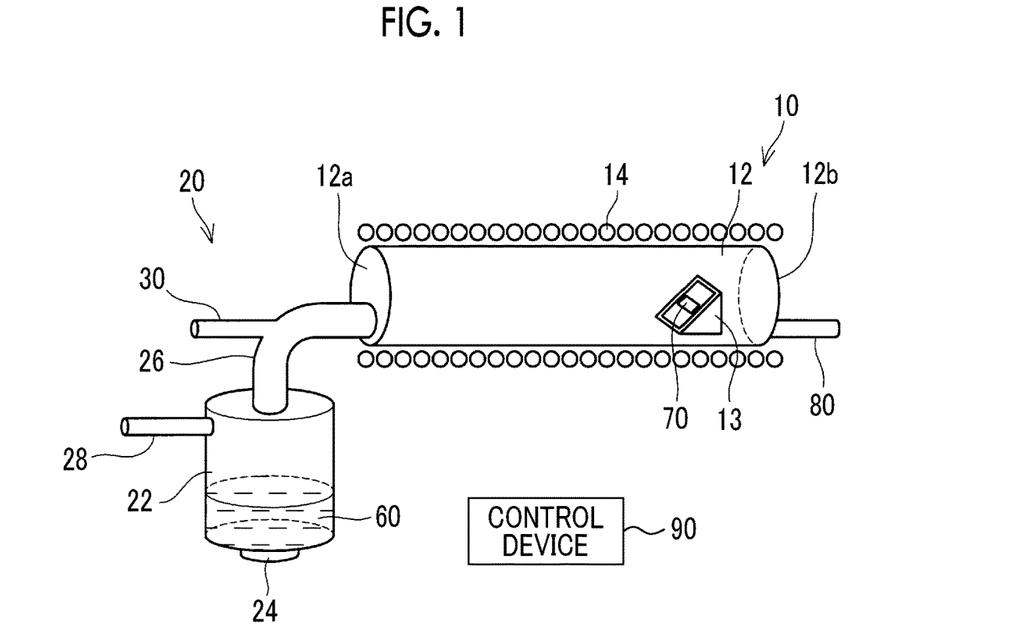
FIG. 1 is a configuration diagram illustrating a film forming device (diagram illustrating an annealing step according to Embodiment 1)

A film forming device 10 illustrated in FIG. 1 forms a film on a substrate 70. The film forming device 10 includes: a furnace 12 in which the substrate 70 is disposed; a heater 14 that heats the furnace 12; a mist supply device 20 that is connected to the furnace 12; an exhaust pipe 80 that is connected to the furnace 12; and a control device 90.

A specific configuration of the furnace 12 is not particularly limited. For example, the furnace 12 illustrated in FIG. 1 is a tubular furnace that extends from an upstream end 12a to a downstream end 12b. A section of the furnace 12 perpendicular to a longitudinal direction is circular. The section of the furnace 12 is not limited to a circular section. The mist supply device 20 is connected to the upstream end 12a of the furnace 12. The exhaust pipe 80 is connected to the downstream end 12b of the furnace 12.

In the furnace 12, a substrate stage 13 for supporting the substrate 70 is provided. The substrate stage 13 is configured such that the substrate 70 is tilted with respect to the longitudinal direction of the furnace 12. The substrate 70 is supported by the substrate stage 13 in a direction in which gas flowing from the upstream end 12a to the downstream end 12b in the furnace 12 comes into contact with the surface of the substrate 70.

The heater 14 heats the furnace 12 as described above. A specific configuration of the heater 14 is not particularly limited. For example, the heater 14 illustrated in FIG. 1 is an electric heater and is disposed along an outer peripheral wall of the furnace 12. As a result, the heater 14 heats the outer peripheral wall of the furnace 12 such that the substrate 70 in the furnace 12 is heated.

The mist supply device 20 supplies mist of a raw material solution of a film into the furnace 12. The mist supply device 20 can also supply gas (for example, nitrogen ($N_2$) gas or oxygen ($O_2$) gas) into the furnace 12. A specific configuration of the mist supply device 20 is not particularly limited. For example, the mist supply device 20 illustrated in FIG. 1 includes: a container 22 that contains a raw material solution 60; an ultrasonic vibrator 24 that is provided in the container 22; a mist supply path 26 that connects the container 22 and the furnace 12 to each other; a carrier gas introduction path 28 that is connected to the container 22; and a diluent gas introduction path 30 that is connected to the mist supply path 26. The carrier gas introduction path 28 supplies carrier gas to the container 22. The diluent gas introduction path 30 supplies diluent gas to the mist supply path 26. The ultrasonic vibrator 24 applies ultrasonic vibration to the raw material solution 60 in the container 22 to produce mist of the raw material solution 60.

The exhaust pipe 80 is connected to the downstream end 12b of the furnace 12. The mist and the gas supplied into the furnace 12 by the mist supply device 20 flow up to the downstream end 12b in the furnace 12 and then is exhausted to the outside of the furnace 12 through the exhaust pipe 80.

The control device 90 controls the respective portions of the film forming device 10. For example, the control device 90 controls, for example, the heater 14, the ultrasonic vibrator 24, the carrier gas introduction path 28 (more specifically, a gas supply device (not illustrated) that supplies gas to the carrier gas introduction path 28), and the diluent gas introduction path 30 (more specifically, a gas supply device (not illustrated) that supplies gas to the diluent gas introduction path 30).

A film forming method using the film forming device 10 will be described. In Embodiment 1, a method of forming an α-type gallium oxide film on the substrate 70 which is a sapphire substrate will be described. In Embodiment 1, a gallium acetylacetonate aqueous solution is used as the raw material solution 60. In Embodiment 1, nitrogen gas is used as the carrier gas, and nitrogen gas is used as the diluent gas. In the film forming method according to Embodiment 1, an annealing step of heating the substrate 70 is performed, and then a film forming step of forming a film on the substrate 70 is performed.

FIG. 1 illustrates the annealing step according to Embodiment 1. As illustrated in FIG. 1, in the annealing step, the substrate 70 is provided on the substrate stage 13 in the furnace 12. In the annealing step, the mist and the gas are not supplied from the mist supply device 20 to the furnace 12. In the annealing step, the furnace 12 is opened to the atmosphere through a vent (not illustrated). Therefore, the atmosphere is present in the furnace 12. In the annealing step, the control device 90 causes the heater 14 to heat the substrate 70. The substrate 70 is heated to a temperature of 500° C. or higher (for example, 1100° C. (in this specification, the meaning of "1100° C." includes "about 1100° C.")).

A small amount of impurities are attached to a surface of the substrate 70. In a case where the substrate 70 is annealed in the annealing step, the impurities attached to the surface of the substrate 70 are vaporized such that the impurities are removed from the surface of the substrate 70.

The control device 90 decreases an output of the heater 14 such that the temperature of the substrate 70 decreases. After the temperature of the substrate 70 becomes stable, the film forming step is performed while causing the heater 14 to maintain the substrate 70 at the temperature. For example, the film forming step is performed while maintaining the substrate 70 at 450° C. (in this specification, the meaning of "450° C." includes "about 450° C.").

Figure 2:
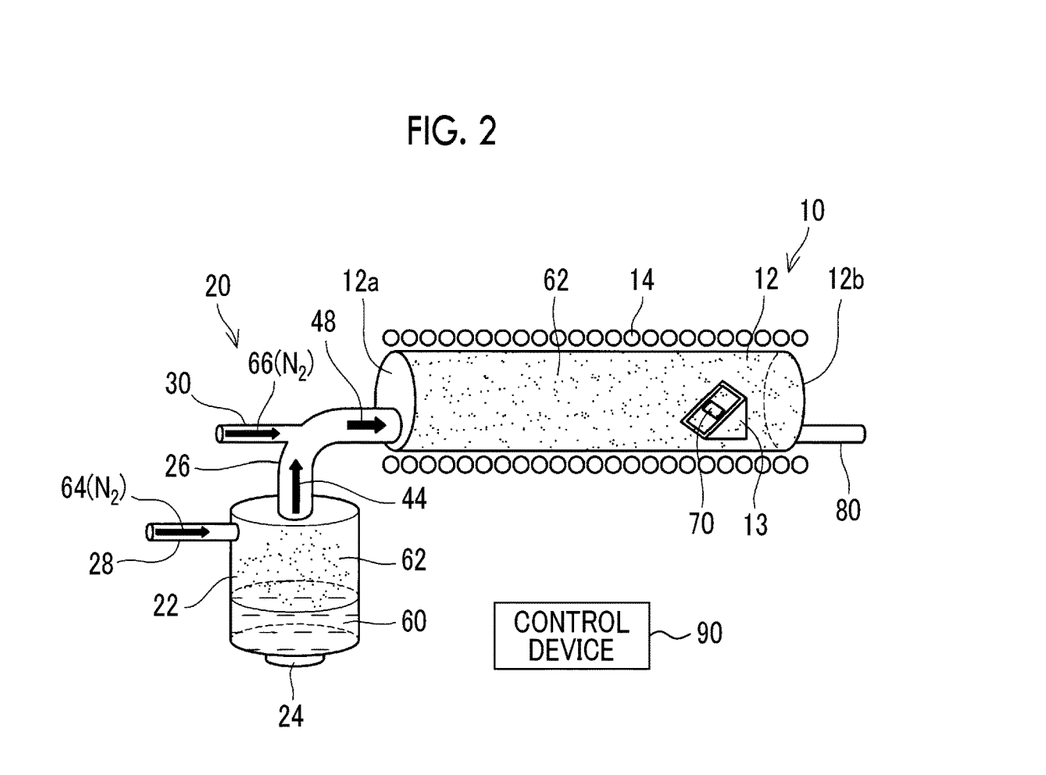
FIG. 2 is a configuration diagram illustrating the film forming device (diagram illustrating a film forming step according to Embodiment 1)

FIG. 2 illustrates the film forming step according to Embodiment 1. In the film forming step, the control device 90 causes the ultrasonic vibrator 24 to operate. As a result, mist 62 of the raw material solution 60 is produced in the container 22. The control device 90 introduces carrier gas 64 (nitrogen gas) from the carrier gas introduction path 28 into the container 22. The carrier gas 64 flows into the mist supply path 26 through the container 22 as indicated by an arrow 44. At this time, the mist 62 in the container 22 flows into the mist supply path 26 along with the carrier gas 64. The control device 90 introduces diluent gas 66 (nitrogen gas) from the diluent gas introduction path 30 to the mist supply path 26. The diluent gas 66 is mixed with the mist 62 in the mist supply path 26. As a result, the mist 62 is diluted. The mist 62 flows to the downstream side in the mist supply path 26 along with the nitrogen gas (that is, the carrier gas 64 and the diluent gas 66), and then flows from the mist supply path 26 into the furnace 12 as indicated by an arrow 48. In the furnace 12, the mist 62 flows to the downstream end 12b along with the nitrogen gas and then is exhausted to the exhaust pipe 80. In the film forming step, an internal pressure of the furnace 12 is equal to the atmospheric pressure (in this specification, the meaning of "equal" includes "substantially equal).

A part of the mist 62 flowing through the inside of the furnace 12 is attached to the surface of the heated substrate 70. In this case, the mist 62 (that is, the raw material solution 60) causes a chemical reaction to occur on the substrate 70. As a result, α-type gallium oxide is formed on the substrate 70. Since the mist 62 is intermittently supplied to the surface of the substrate 70, the α-type gallium oxide film grows on the surface of the substrate 70.

As described above, in the annealing step, the impurities are removed from the surface of the substrate 70. After the annealing step is performed, the film forming step is continuously performed without removing the substrate 70 from the furnace 12. Therefore, after the start of the film forming step, substantially no impurities are attached to the surface of the substrate 70. Accordingly, in the film forming step, the α-type gallium oxide film can be caused to grow on the surface of the clean substrate 70 on which substantially no impurities are present. Therefore, incorporation of the impurities into the α-type gallium oxide film can be suppressed. Accordingly, a change in characteristics (for example, electrical characteristics) of the α-type gallium oxide film depending on the effect of the impurities can be suppressed. Therefore, the characteristics of the α-type gallium oxide film can be accurately controlled to obtain desired characteristics, and a variation in the characteristics can be suppressed.

As described above, in the film forming method according to Embodiment 1, a high-quality α-type gallium oxide film can be formed.

A film forming method according to Embodiment 2 will be described. In Embodiment 2, as in the case of Embodiment 1, a film is formed using the film forming device 10. In Embodiment 2, a method of forming a homoepitaxial film of β-type gallium oxide on the substrate 70 which is a β-type gallium oxide substrate will be described. In Embodiment 2, a gallium chloride aqueous solution is used as the raw material solution 60. In Embodiment 2, oxygen gas is used as the carrier gas 64, and oxygen gas is used as the diluent gas 66. Even in the film forming method according to Embodiment 2, an annealing step of heating the substrate 70 is performed, and then a film forming step of forming a film on the substrate 70 is performed.

Figure 3:
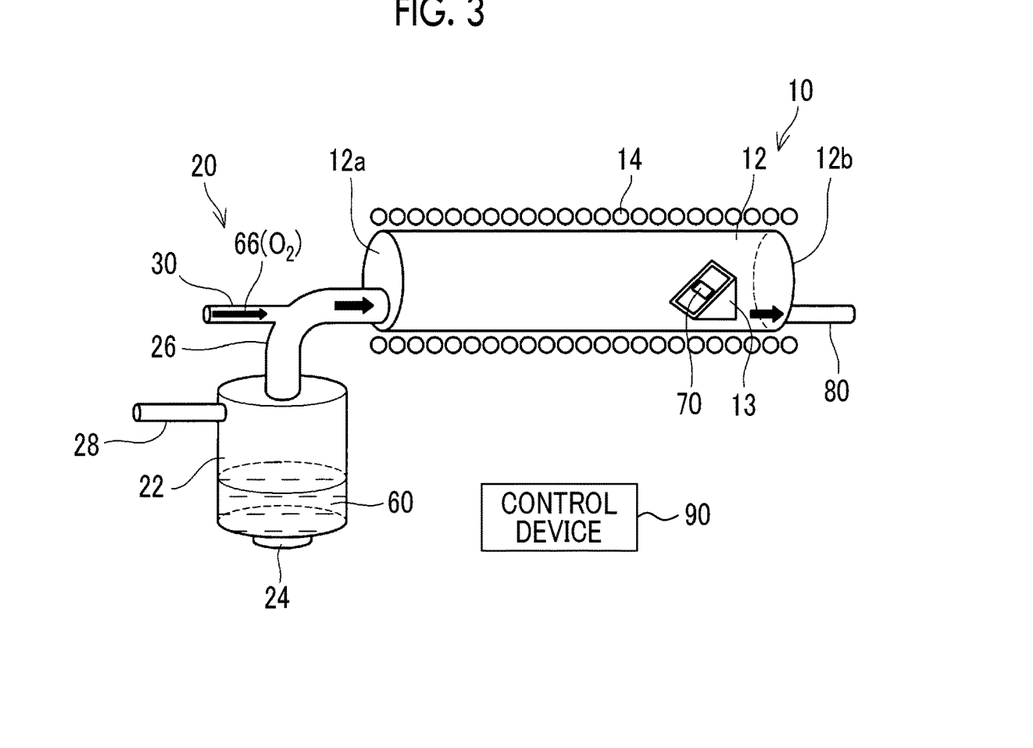
FIG. 3 is a configuration diagram illustrating the film forming device (diagram illustrating an annealing step according to Embodiment 2)

FIG. 3 illustrates the annealing step according to Embodiment 2. As illustrated in FIG. 3, in the annealing step, the substrate 70 is provided on the substrate stage 13 in the furnace 12. In the annealing step, the control device 90 introduces oxygen gas 66 from the diluent gas introduction path 30 to the mist supply path 26. As indicated by arrows in FIG. 3, the oxygen gas 66 flows through the inside of the furnace 12 and is exhausted to the exhaust pipe 80. In the annealing step, an internal pressure of the furnace 12 is equal to the atmospheric pressure. The furnace 12 is filled with the oxygen gas 66. Therefore, an oxygen partial pressure in the furnace 12 is higher than an oxygen partial pressure in the atmosphere. In the annealing step, the control device 90 causes the heater 14 to heat the substrate 70. The substrate 70 is heated to a temperature of 900° C. (in this specification, the meaning of "900° C." includes "about 900° C."). The annealing step is performed in a state where the oxygen gas 66 is flowing as indicated by arrows in FIG. 3.

In the annealing step according to Embodiment 2, as in the case of the annealing step according to Embodiment 1, the impurities attached to the surface of the substrate 70 are vaporized such that the impurities are removed from the surface of the substrate 70. In Embodiment 2, the annealing step is performed in the oxygen gas 66. Therefore, organic impurities attached to the surface of the substrate 70 is oxidized and vaporized. Thus, the organic impurities can be removed from the surface of the substrate 70. In Embodiment 2, the annealing step is performed in a state where the oxygen gas 66 is flowing through the inside of the furnace 12. Therefore, the impurities vaporized from the surface of the substrate 70 rapidly flow from the furnace 12 to the exhaust pipe 80. Thus, the impurities can be removed more favorably.

In Embodiment 2, in a case where the substrate 70 is annealed, atomic migration occurs in the surface of the substrate 70 (that is, the β-type gallium oxide substrate) such that atoms are arranged on the surface of the substrate 70.

In the substrate 70 (that is, the β-type gallium oxide substrate), oxygen defects are present. The oxygen defects occur at oxygen sites (in a case where atoms are arranged in a crystal lattice, positions where an oxygen atom is to be arranged). In the annealing step according to Embodiment 2, the substrate 70 is annealed in an atmosphere having a high oxygen partial pressure. Therefore, oxygen atoms are filled in the gas into the oxygen defects. As a result, the number of oxygen defects in the substrate 70 is reduced. Therefore, the crystallinity of the substrate 70 is improved. The oxygen defects supply electrons as carriers. By reducing the number of oxygen defects, the unintended production of carriers can be suppressed, and the carrier density in the substrate 70 can be accurately controlled.

The control device 90 decreases an output of the heater 14 such that the temperature of the substrate 70 decreases. After the temperature of the substrate 70 becomes stable, the film forming step is performed while causing the heater 14 to maintain the substrate 70 at the temperature. For example, the film forming step is performed while maintaining the substrate 70 at 750° C. (in this specification, the meaning of "750° C." includes "about 750° C.").

Figure 4:
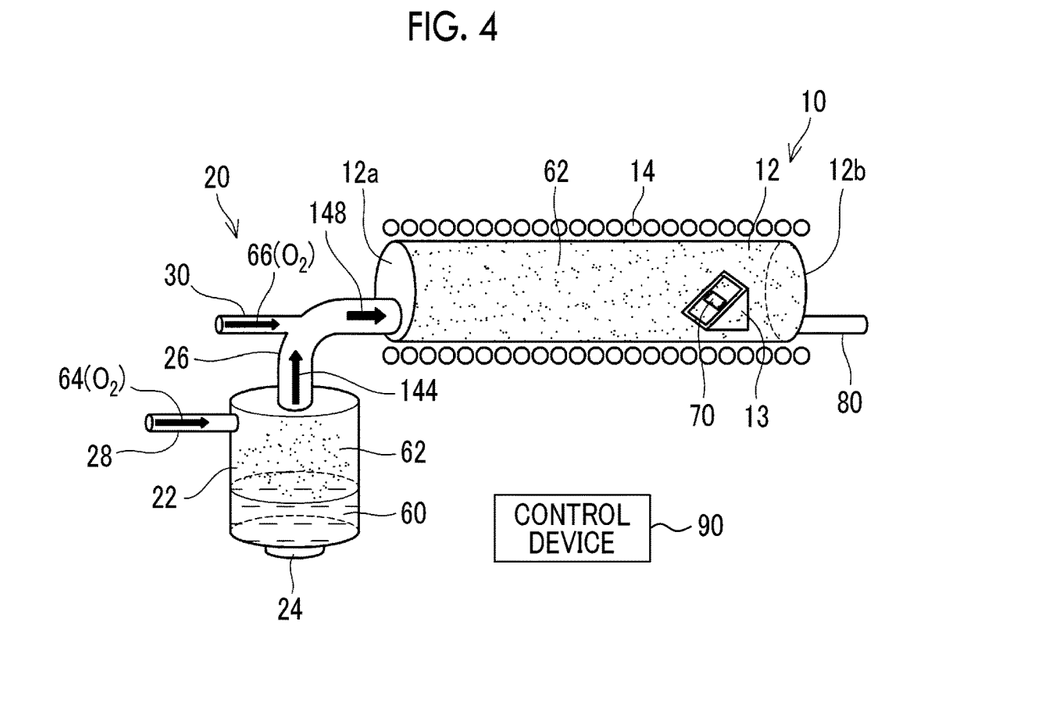
FIG. 4 is a configuration diagram illustrating the film forming device (diagram illustrating a film forming step according to Embodiment 2)

FIG. 4 illustrates the film forming step according to Embodiment 2. In the film forming step, the control device 90 causes the ultrasonic vibrator 24 to operate As a result, mist 62 of the raw material solution 60 is produced in the container 22. The control device 90 introduces the carrier gas 64 (oxygen gas) from the carrier gas introduction path 28 into the container 22. The carrier gas 64 flows into the mist supply path 26 through the container 22 as indicated by an arrow 144. At this time, the mist 62 in the container 22 flows into the mist supply path 26 along with the carrier gas 64. The control device 90 introduces the diluent gas 66 (oxygen gas) from the diluent gas introduction path 30 to the mist supply path 26. The diluent gas 66 is mixed with the mist 62 in the mist supply path 26. As a result, the mist 62 is diluted. The mist 62 flows to the downstream side in the mist supply path 26 along with the gas (that is, the carrier gas 64 and the diluent gas 66), and then flows from the mist supply path 26 into the furnace 12 as indicated by an arrow 148. In the furnace 12, the mist 62 flows to the downstream end 12b along with the oxygen gas and then is exhausted to the exhaust pipe 80. In the film forming step, an internal pressure of the furnace 12 is equal to the atmospheric pressure.

A part of the mist 62 flowing through the inside of the furnace 12 is attached to the surface of the heated substrate 70. In this case, the mist 62 (that is, the raw material solution 60) causes a chemical reaction to occur on the substrate 70. As a result, β-type gallium oxide is formed on the substrate 70. Since the mist 62 is intermittently supplied to the surface of the substrate 70, the homoepitaxial film of β-type gallium oxide grows on the surface of the substrate 70.

As described above, in the annealing step, the impurities are removed from the surface of the substrate 70. After the annealing step is performed, the film forming step is continuously performed without removing the substrate 70 from the furnace 12. Therefore, in the film forming step, incorporation of the impurities into the homoepitaxial film can be suppressed. Therefore, in the film forming method according to Embodiment 2, the characteristics of the homoepitaxial film can be accurately controlled to obtain desired characteristics, and a variation in the characteristics can be suppressed.

As described above, in the annealing step, atoms are arranged on the surface of the substrate 70. Accordingly, in the film forming step, the homoepitaxial film can be caused to grow on the surface of the substrate 70 on which the atoms are arranged. Therefore, a dense homoepitaxial film having a small number of crystal defects can be formed.

As described above, in the film forming method according to Embodiment 2, a high-quality homoepitaxial film of β-type gallium oxide can be formed.

A film forming method according to Embodiment 3 will be described. In Embodiment 3, a film is formed using a film forming device 110 illustrated in FIGS. 5 and 6. In the film forming device 110, a mist supply device 220 may be further added to the film forming device 10 used in Embodiments 1 and 2.

Figure 5:
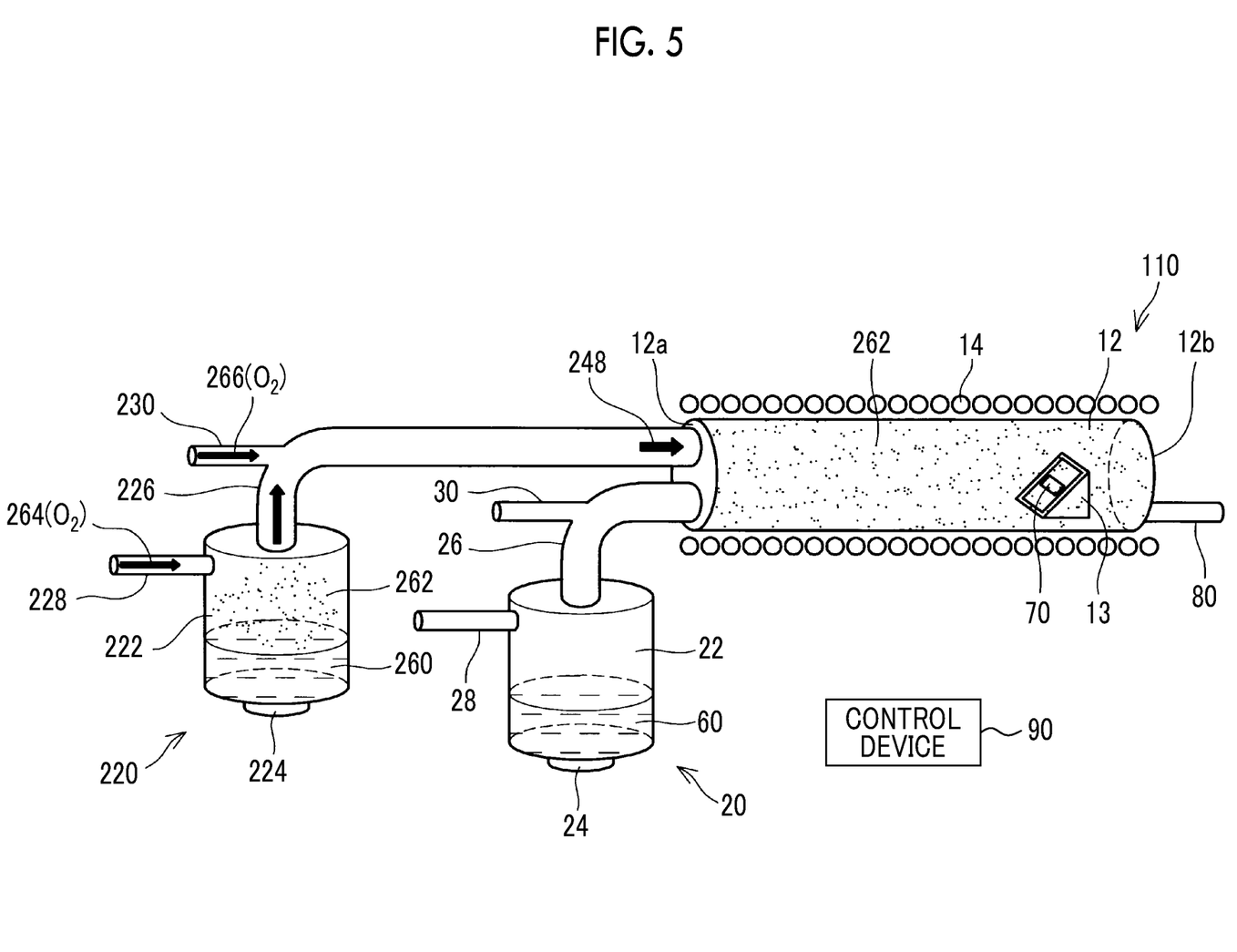
FIG. 5 is a configuration diagram illustrating a film forming device (diagram illustrating an annealing step according to Embodiment 3)
Figure 6:
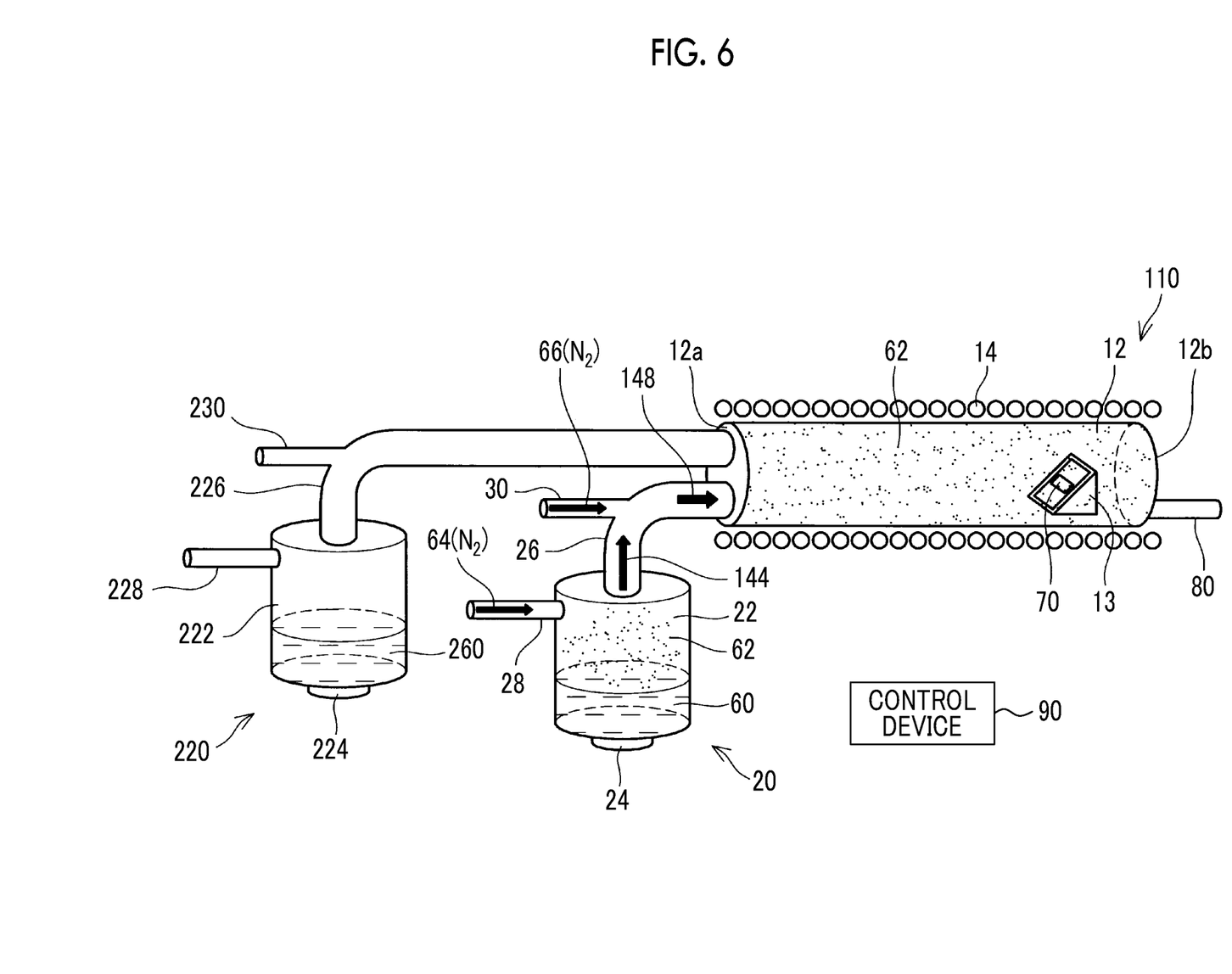
FIG. 6 is a configuration diagram illustrating the film forming device (diagram illustrating a film forming step according to Embodiment 3).

The mist supply device 220 is connected to the upstream end 12a of the furnace 12. The mist supply device 220 supplies mist of water ($H_2O$) into the furnace 12. A specific configuration of the mist supply device 220 is not particularly limited. For example, the mist supply device 220 according to the embodiment includes: a container 222 that contains water 260 ($H_2O$) as a liquid; an ultrasonic vibrator 224 that is provided in the container 222; a mist supply path 226 that connects the container 222 and the furnace 12 to each other, a carrier gas introduction path 228 that is connected to the container 222; and a diluent gas introduction path 230 that is connected to the mist supply path 226. The carrier gas introduction path 228 supplies carrier gas 264 (in the embodiment, oxygen gas) to the container 222. The diluent gas introduction path 230 supplies diluent gas 266 (in the embodiment, oxygen gas) to the mist supply path 226. The ultrasonic vibrator 224 applies ultrasonic vibration to the water 260 in the container 222 to produce a water mist 262.

In Embodiment 3, a homoepitaxial film of β-type gallium oxide is formed on the substrate 70 which is a β-type gallium oxide substrate. In Embodiment 3, a gallium chloride aqueous solution is used as the raw material solution 60. In Embodiment 3, nitrogen gas is used as the carrier gas 64, and nitrogen gas is used as the diluent gas 66. Even in the film forming method according to Embodiment 3, an annealing step of heating the substrate 70 is performed, and then a film forming step of forming a film on the substrate 70 is performed.

FIG. 5 illustrates the annealing step according to Embodiment 3. As illustrated in FIG. 5, in the annealing step, the substrate 70 is provided on the substrate stage 13 in the furnace 12. In the annealing step according to Embodiment 3, the mist and the gas are supplied from the mist supply device 220 to the furnace 12 instead of supplying the mist and the gas from the mist supply device 20 to the furnace 12. In the annealing step, the control device 90 causes the mist supply device 220 to operate. That is, the control device 90 causes the ultrasonic vibrator 224 to operate. As a result, the mist 262 of the water 260 is produced in the container 222. The control device 90 introduces the carrier gas 264 (oxygen gas) from the carrier gas introduction path 228 into the container 222. The carrier gas 264 flows into the mist supply path 226 through the container 222 as indicated by an arrow 244. At this time, the mist 262 in the container 222 flows into the mist supply path 226 along with the carrier gas 264. The control device 90 introduces the diluent gas 266 (oxygen gas) from the diluent gas introduction path 230 to the mist supply path 226. The diluent gas 266 is mixed with the mist 262 in the mist supply path 226. As a result, the mist 262 is diluted. The mist 262 flows to the downstream side in the mist supply path 226 along with the oxygen gas (that is, the carrier gas 264 and the diluent gas 266), and then flows from the mist supply path 226 into the furnace 12 as indicated by an arrow 248. In the furnace 12, the mist 262 flows to the downstream end 12b along with the oxygen gas and then is exhausted to the exhaust pipe 80. In the annealing step, the control device 90 causes the heater 14 to heat the substrate 70. The substrate 70 is heated to 900° C. The annealing step is performed in a state where the mist 262 is flowing through the inside of the furnace 12.

In the annealing step according to Embodiment 3, as in the case of the annealing step according to Embodiment 1, the impurities attached to the surface of the substrate 70 are vaporized such that the impurities are removed from the surface of the substrate 70. In the annealing step according to Embodiment 3, the water mist 262 is supplied to the surface of the substrate 70. Due to the oxidation action of water, an organic impurity attached to the surface of the substrate 70 is oxidized and vaporized. Thus, the organic impurities can be removed from the surface of the substrate 70. In Embodiment 3, the annealing step is performed in a state where the mist 262 and the oxygen gas (the carrier gas 264 and the diluent gas 266) are flowing through the inside of the furnace 12. Therefore, the impurities vaporized from the surface of the substrate 70 rapidly flow from the furnace 12 to the exhaust pipe 80. Thus, the impurities can be removed more favorably.

In Embodiment 3, in a case where the substrate 70 is annealed, atomic migration occurs in the surface of the substrate 70 (that is, the β-type gallium oxide substrate) such that atoms are arranged on the surface of the substrate 70.

In Embodiment 3, due to the oxidation action of the mist 262 (that is, water) supplied to the surface of the substrate 70, the oxygen defects of the substrate 70 are filled with oxygen atoms (oxygen atoms produced by decomposition of water). As a result, the number of oxygen defects in the substrate 70 is reduced. Therefore, the crystallinity of the substrate 70 is improved.

The control device 90 decreases an output of the heater 14 such that the temperature of the substrate 70 decreases. After the temperature of the substrate 70 becomes stable, the film forming step is performed while causing the heater 14 to maintain the substrate 70 at the temperature. For example, the film forming step is performed while maintaining the substrate 70 at 800° C. (in this specification, the meaning of "800° C." includes "about 800° C.").

FIG. 6 illustrates the film forming step according to Embodiment 3. In the film forming step according to Embodiment 3, the mist and the gas are supplied from the mist supply device 20 to the furnace 12 instead of supplying the mist and the gas from the mist supply device 220 to the furnace 12. The film forming step according to Embodiment 3 is performed under the same conditions as in the film forming step (FIG. 4) according to Embodiment 2. Accordingly, a homoepitaxial film of β-type gallium oxide grows on the surface of the substrate 70.

As described above, in the annealing step, the impurities are removed from the surface of the substrate 70. After the annealing step is performed, the film forming step is continuously performed without removing the substrate 70 from the furnace 12. Therefore, in the film forming step, incorporation of the impurities into the homoepitaxial film can be suppressed. Therefore, in the film forming method according to Embodiment 3, the characteristics of the homoepitaxial film can be accurately controlled to obtain desired characteristics, and a variation in the characteristics can be suppressed.

As described above, in the annealing step that is performed before the film forming step, atoms are arranged on the surface of the substrate 70. Accordingly, in the film forming step, the homoepitaxial film can be caused to grow on the surface of the substrate 70 on which the atoms are arranged. Therefore, a dense homoepitaxial film having a small number of crystal defects can be formed.

In Embodiment 3, the mists 62 and 262 are supplied into the furnace 12 in both the annealing step and the film forming step. Therefore, the process can be shifted from the annealing step to the film forming step in a state where the mists are present in the furnace 12. Therefore, during the shift from the annealing step to the film forming step, a fluctuation in the temperature of the substrate 70 can be alleviated. As a result, stress on the substrate 70 can be alleviated.

In Embodiment 3, the water mist 262 is supplied into the furnace 12 in the annealing step. However, water vapor may be supplied into the furnace 12 instead of the mist 262. Even in a case where water vapor is supplied, as in the case of Embodiment 3 (in this specification, the meaning of "as in the case" includes "substantially as in the case"), organic impurities can be removed due to the oxidation action of water, and oxygen defects can be eliminated.

Hereinabove, the film forming methods according to Embodiments 1 to 3 have been described. Using the film that is formed with the film forming method according to any one of Embodiments 1 to 3, a semiconductor device can be manufactured. That is, the film that is formed with the film forming method according to any one of Embodiments 1 to 3 can be made to be a part of the semiconductor device. For example, in a case where impurities are incorporated into a crystalline film of the semiconductor device, the impurities may be a factor that causes a leakage current to be generated. By manufacturing the semiconductor device using the film forming method according to any one of Embodiments 1 to 3, incorporation of impurities into a crystalline film can be suppressed, and the generation of a leakage current can be suppressed.

In Embodiments 1 to 3, the annealing step and the film forming step are performed in a common furnace. However, the annealing step and the film forming step may be performed in different furnaces. That is, after performing the annealing step, the substrate 70 is moved from a furnace for the annealing step to a furnace for the film forming step such that the film forming step is performed in the furnace for the film forming step. With this configuration, a high-quality film can be formed. While the substrate 70 is moving, impurities may be attached to the surface of the substrate 70. Therefore, it is more desirable that the annealing step and the film forming step are performed in a common furnace.

In Embodiments 1 to 3, a single-crystal film is formed. However, a polycrystalline or amorphous film may be formed.

The technical features disclosed in this specification will be described below. The following technical features are each independently useful.

In the film forming method according to the example disclosed in this specification, the substrate may be formed of an oxide material. In this case, the annealing may be performed in a state where the substrate is disposed in gas including oxygen.

In the substrate formed of an oxide material, oxygen defects are present. The oxygen defects occur at oxygen sites (in a case where atoms are arranged in a crystal lattice, positions where an oxygen atom is to be arranged). As described above, by performing the annealing in a state where the substrate is disposed in gas including oxygen, oxygen defects are filled with oxygen atoms, and the number of oxygen defects can be reduced. As a result, the crystallinity of the substrate can be improved.

In the film forming method according to the example disclosed in this specification, the annealing may be performed in a state where the substrate is disposed in gas having a higher oxygen partial pressure than the atmosphere.

With the above-described configuration, oxygen defects can be eliminated more effectively.

In the film forming method according to the example disclosed in this specification, the substrate may be formed of an oxide material. In this case, the annealing may be performed in a state where the substrate is disposed in gas including at least one of water mist and water vapor.

With the above-described configuration, oxygen atoms included in water molecules are filled into oxygen defects, and thus oxygen defects can be eliminated. As a result, the crystallinity of the substrate can be improved.

In the film forming method according to the example disclosed in this specification, the annealing may be performed in a state where the substrate is disposed in flowing gas.

With the above-described configuration, impurities vaporized from the surface of the substrate flow along with the flowing gas. Therefore, the surface of the substrate can be cleaned more effectively.

In the film forming method according to the example disclosed in this specification, the annealing and the supply of the mist of the raw material solution to the surface of the substrate may be performed in a common furnace.

With the above-described configuration, the supply of the mist can start in a state where the surface of the substrate is cleaned. Accordingly, a higher-quality film can be formed.

In the film forming method according to the example disclosed in this specification, during the annealing, the substrate may be heated to a temperature of 500° C. or higher.

With the above-described configuration, impurities on the surface of the substrate can be vaporized favorably.

In the film forming method according to the example disclosed in this specification, the film may be a crystalline film of a semiconductor.

Hereinabove, the embodiments have been described in detail. However, these examples are merely exemplary and do not limit the claims. The technique described in the claims includes various modifications and alternations of the above-described specific examples. The technical features described in this specification and the drawings exhibit technical significance when being used alone or in a combination thereof, and are not limited to the combinations described in the claims at the time of filing of the application. The technique exemplified in this specification or the drawings simultaneously achieves plural objects, and the technical significance is obtained by achieving one of the objects.

What is claimed is:

1. A film forming device that forms a film on a substrate, the film forming device comprising:
   a furnace in which the substrate is disposed;
   a heater configured to heat the substrate in the furnace;
   a first mist supply device configured to supply mist of a raw material solution of the film into the furnace;
   a second mist supply device configured to supply a water mist into the furnace; and
   a control device configured to control the heater, the first mist supply device, and the second mist supply device,
   wherein the control device is configured to
      cause the heater to anneal the substrate,
      cause the second mist supply device to supply the water mist to a surface of the substrate during the annealing, and
      cause the first mist supply device to supply the mist to the surface of the substrate after the annealing while causing the heater to heat the substrate at a temperature lower than a temperature of the substrate during the annealing.

* * * * *

UNITED STATES PATENT AND TRADEMARK OFFICE
CERTIFICATE OF CORRECTION

| | | |
|---|---|---|
| PATENT NO. | : 10,854,447 B2 | Page 1 of 1 |
| APPLICATION NO. | : 16/238663 | |
| DATED | : December 1, 2020 | |
| INVENTOR(S) | : Tatsuji Nagaoka | |

It is certified that error appears in the above-identified patent and that said Letters Patent is hereby corrected as shown below:

On the Title Page

Item (71), applicant, city, delete "Kariya" and insert --Kariya-city, Aichi-pref--, therefor.

Item (72), inventor, city, delete "Nagakute" and insert --Nagakute-shi Aichi-ken--, therefor.

Item (73), assignee, city, delete "Kariya" and insert --Kariya-city, Aichi-pref--, therefor.

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*